(12) United States Patent
Barnhouse et al.

(10) Patent No.: US 9,629,256 B2
(45) Date of Patent: Apr. 18, 2017

(54) TOOLS FOR SEATING CONNECTORS ON SUBSTRATES

(71) Applicant: Flextronics Corporation, San Jose, CA (US)

(72) Inventors: Robert Lee Barnhouse, Wake Forest, NC (US); Stephen H. Hancock, Wake Forest, NC (US); Martin H. Kainec, Port St. Lucie, FL (US)

(73) Assignee: Flextronics Corporation, San Jose, CA (US)

( * ) Notice: Subject to any disclaimer, the term of this patent is extended or adjusted under 35 U.S.C. 154(b) by 159 days.

(21) Appl. No.: 14/074,378

(22) Filed: Nov. 7, 2013

(65) Prior Publication Data

US 2015/0121690 A1    May 7, 2015

(51) Int. Cl.
| | |
|---|---|
| B23P 19/00 | (2006.01) |
| H05K 13/04 | (2006.01) |
| H05K 3/30 | (2006.01) |
| H01R 43/20 | (2006.01) |

(52) U.S. Cl.
CPC .......... H05K 3/306 (2013.01); H01R 43/205 (2013.01); *H05K 2201/10189* (2013.01); *H05K 2203/0195* (2013.01); *Y10T 29/53183* (2015.01)

(58) Field of Classification Search
CPC .... H01R 43/205; H01R 43/26; H05K 31/301; H05K 31/306; H05K 2203/0195; Y10T 29/5193; Y10T 29/49139; Y10T 29/53183; Y10T 29/53209; Y10T 29/53239; Y10T 29/53174; Y10T 29/53213; Y10T 29/4913

USPC .... 29/33 M, 426.1, 428, 469, 711, 721, 729, 29/739, 742, 747, 748, 754, 760
See application file for complete search history.

(56) References Cited

U.S. PATENT DOCUMENTS

| | | | |
|---|---|---|---|
| 4,550,962 A * | 11/1985 | Czeschka | H01R 12/585 29/739 |
| 4,837,926 A | 6/1989 | Boutcher, Jr. | |
| 4,969,258 A | 11/1990 | Fisher et al. | |
| 5,099,134 A | 3/1992 | Hase et al. | |
| 5,400,502 A * | 3/1995 | Ota | B23P 19/02 29/564.1 |
| 5,453,016 A | 9/1995 | Clark et al. | |
| 5,730,210 A | 3/1998 | Kou | |
| 5,743,765 A | 4/1998 | Andrews et al. | |

(Continued)

*Primary Examiner* — Paul D Kim
(74) *Attorney, Agent, or Firm* — Sheridan Ross P.C.

(57) ABSTRACT

The present invention relates to connector tools for seating connectors on a substrate such as a printed circuit board. In various embodiments, the connector tools can be made by wire electrode discharge machining (WEDM) process. In the embodiments, the connector tool includes reinforced ribbed end walls, ribbed internal walls, interconnected walls and contours that reduce tool and connector damage. In other embodiments, the connector tools include guiding structures that align the connector tool to the connector before seating the connector so that the connector tool aligns to the connector pins and body to avoid damage to the connector and/or the substrate. In another embodiment, the connector tool has guiding skirts and surfaces to capture the connector in position then seat the connector. Thus, the invention reduces connector and substrate damage during manufacturing, reduces tool damage, and lowers product costs by boosting manufacturing yields.

11 Claims, 14 Drawing Sheets

(56) References Cited

U.S. PATENT DOCUMENTS

| | | |
|---|---|---|
| 6,231,391 B1 | 5/2001 | Ramey et al. |
| 6,835,074 B2 | 12/2004 | Sakata |
| 6,866,523 B2 * | 3/2005 | Yamashita ............. H01R 12/58 439/79 |
| 7,048,595 B2 * | 5/2006 | Nakamura ........... H01R 12/585 439/75 |
| 7,101,224 B2 | 9/2006 | Dattilo et al. |
| 8,136,233 B2 * | 3/2012 | Barnhouse ........... H01R 43/205 29/33 M |

\* cited by examiner

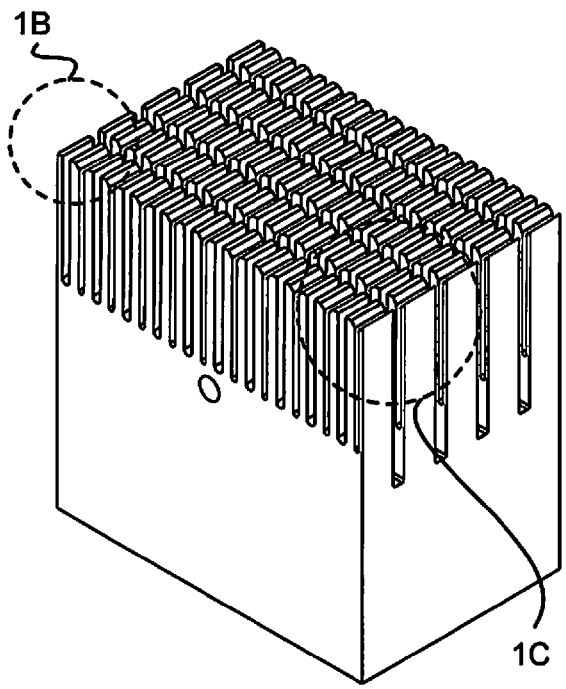
FIGURE 1A - Prior Art
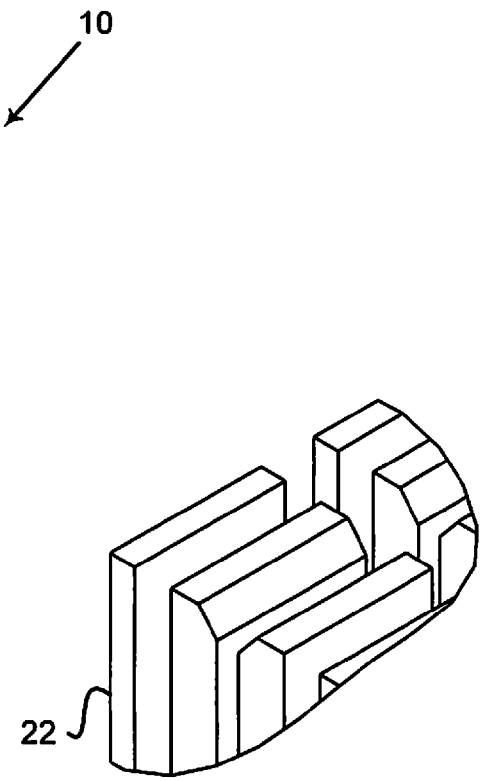
FIGURE 1B - Prior Art
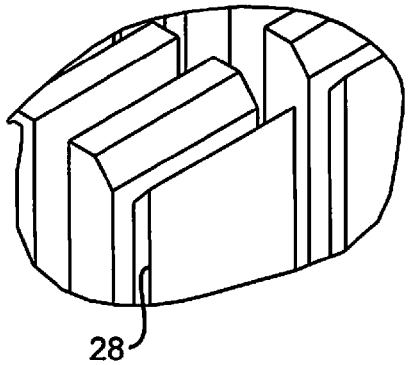
FIGURE 1C - Prior Art
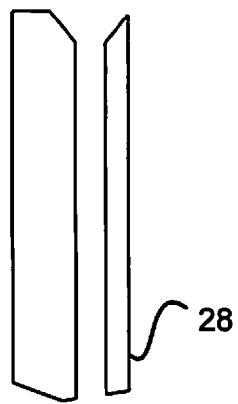
FIGURE 1D - Prior Art

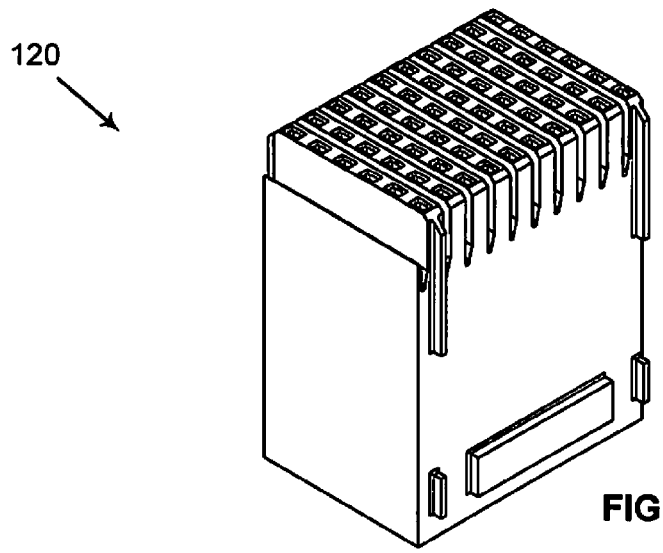
FIGURE 2A - Prior Art
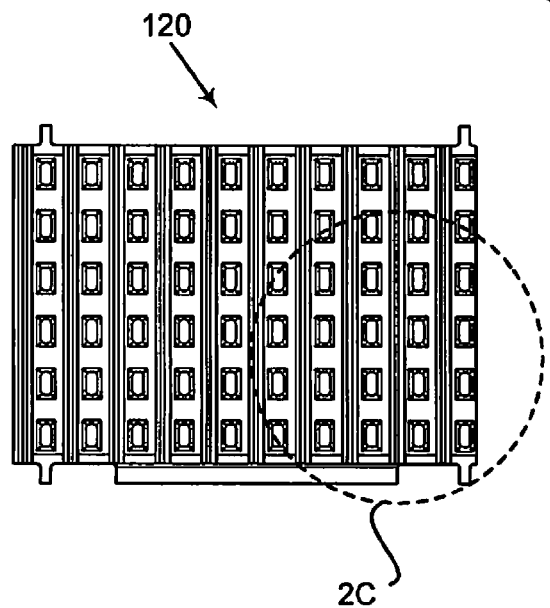
FIGURE 2B - Prior Art
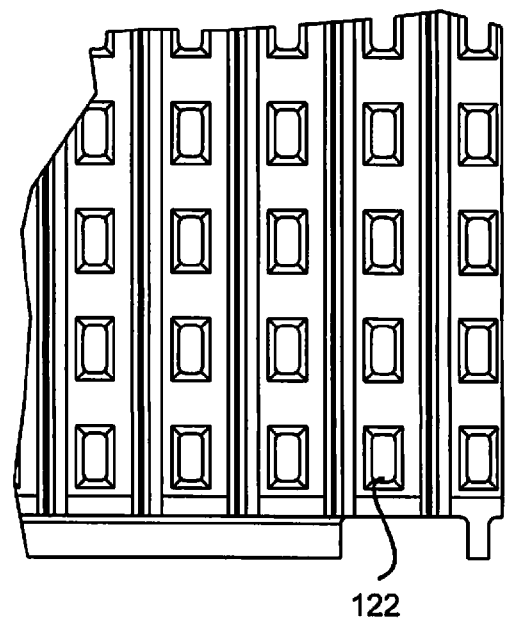
FIGURE 2C - Prior Art

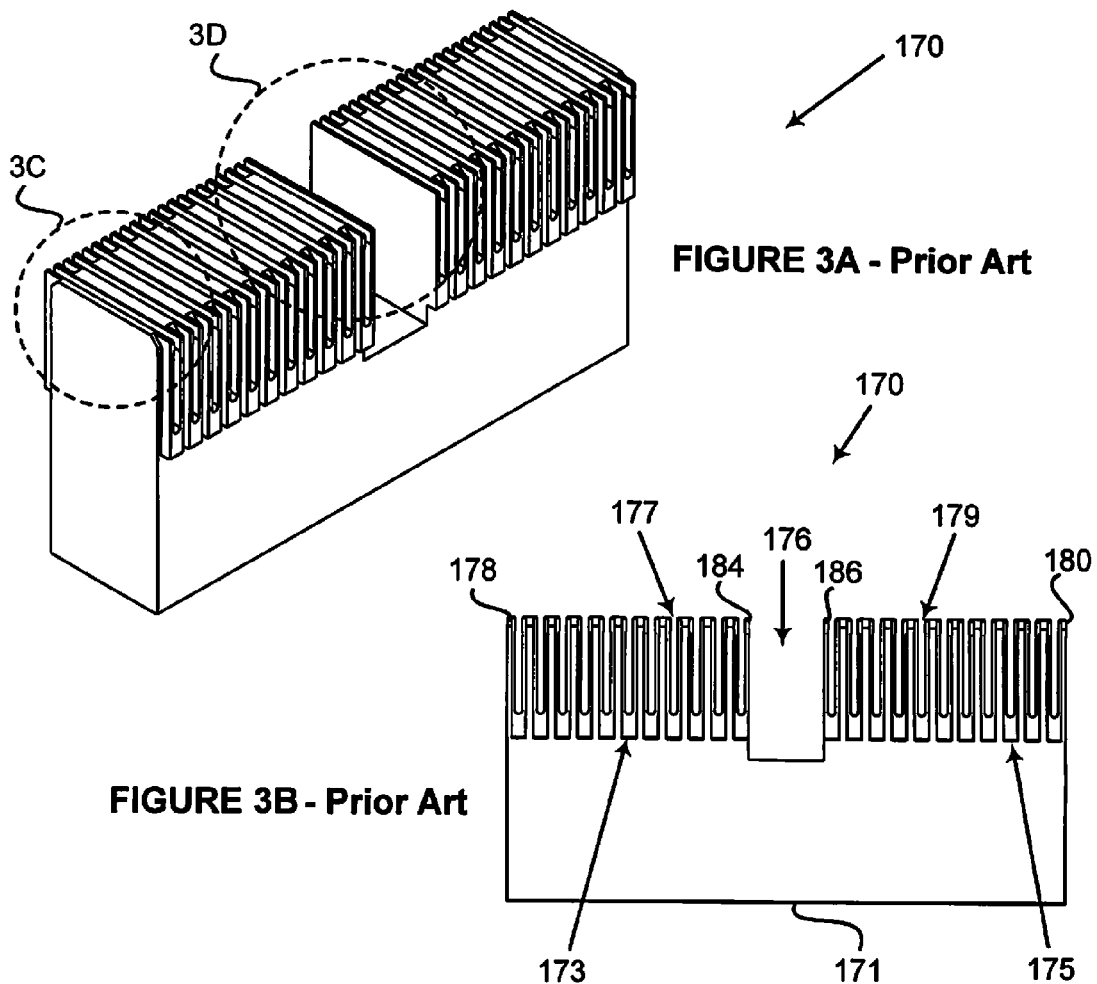
FIGURE 3A - Prior Art
FIGURE 3B - Prior Art
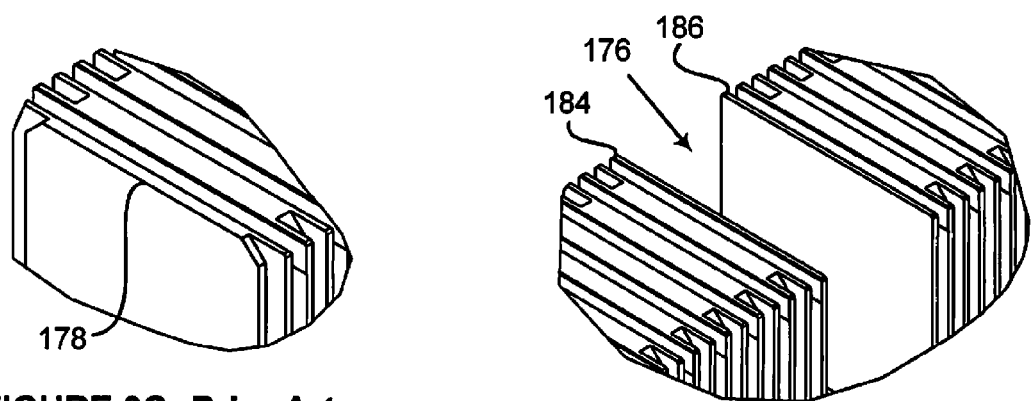
FIGURE 3C - Prior Art
FIGURE 3D - Prior Art

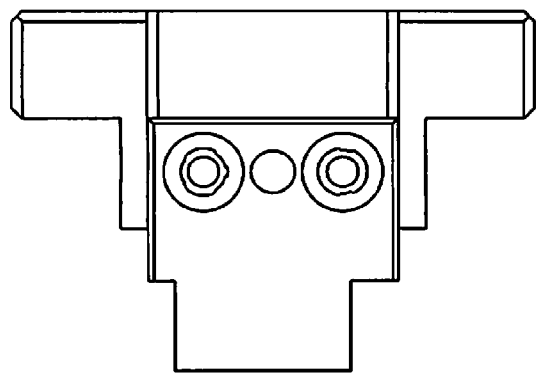
FIGURE 4A - Prior Art
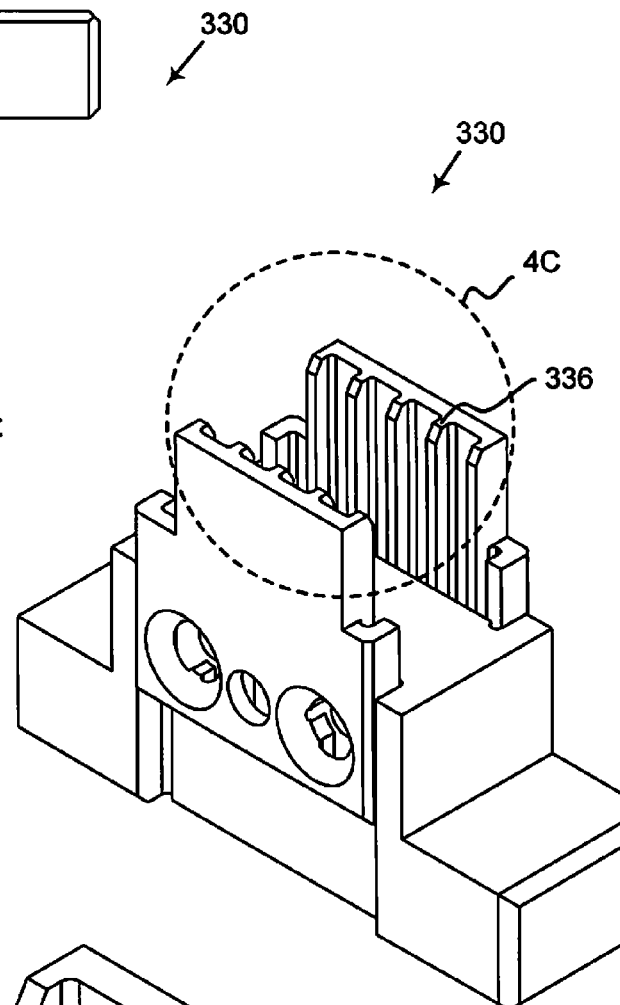
FIGURE 4B - Prior Art
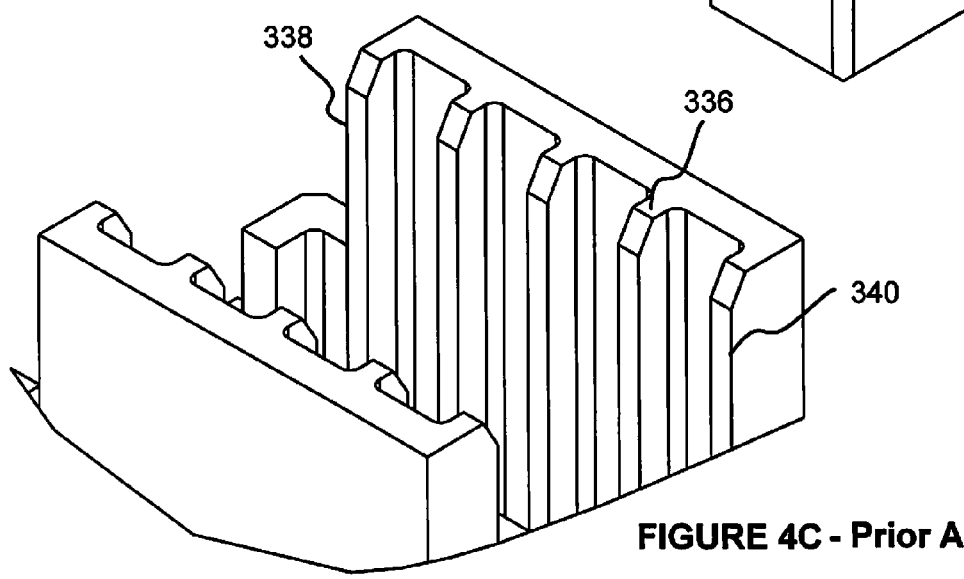
FIGURE 4C - Prior Art

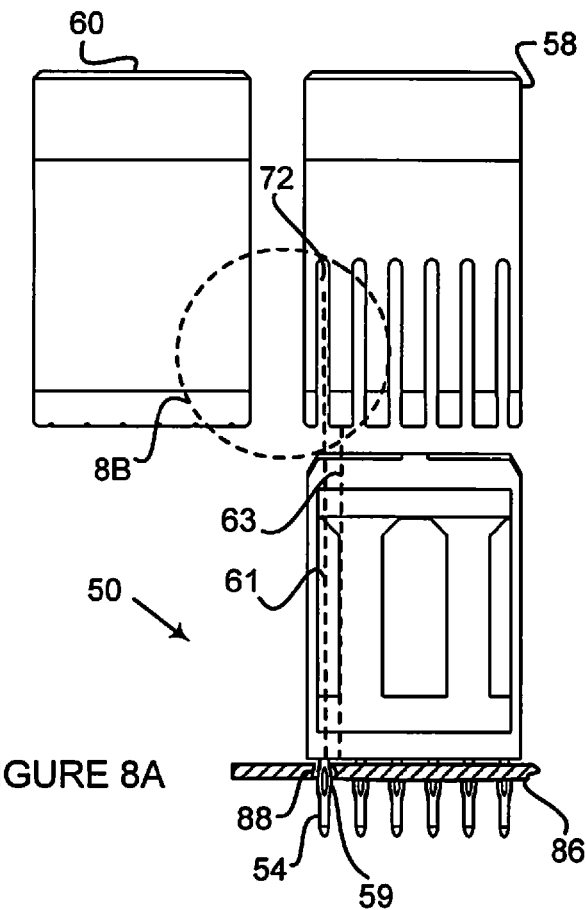
FIGURE 8A
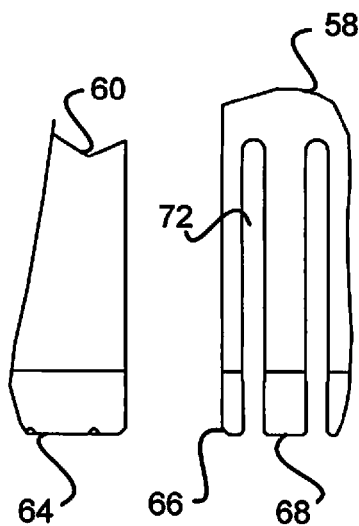
FIGURE 8B
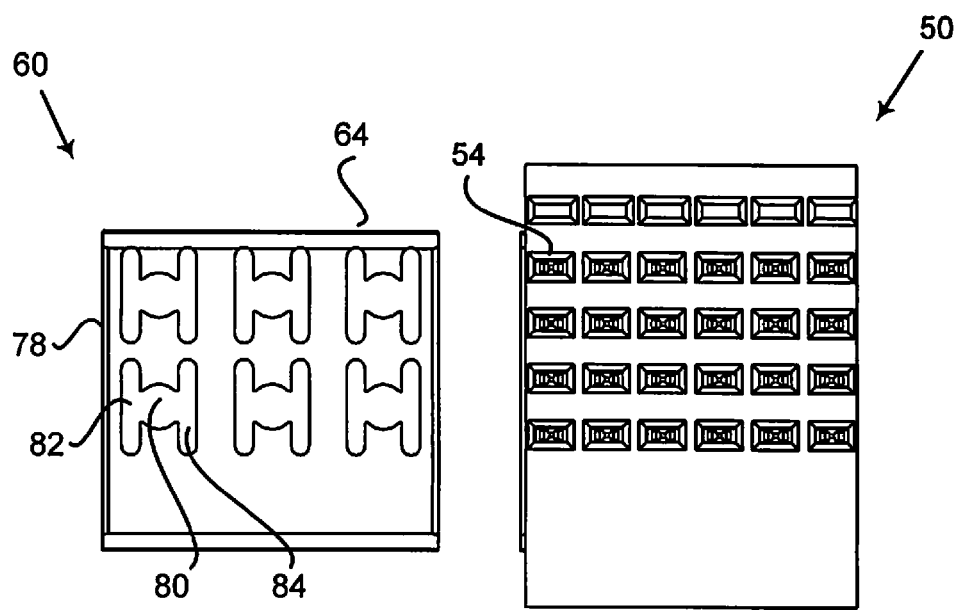
FIGURE 8C
FIGURE 8D

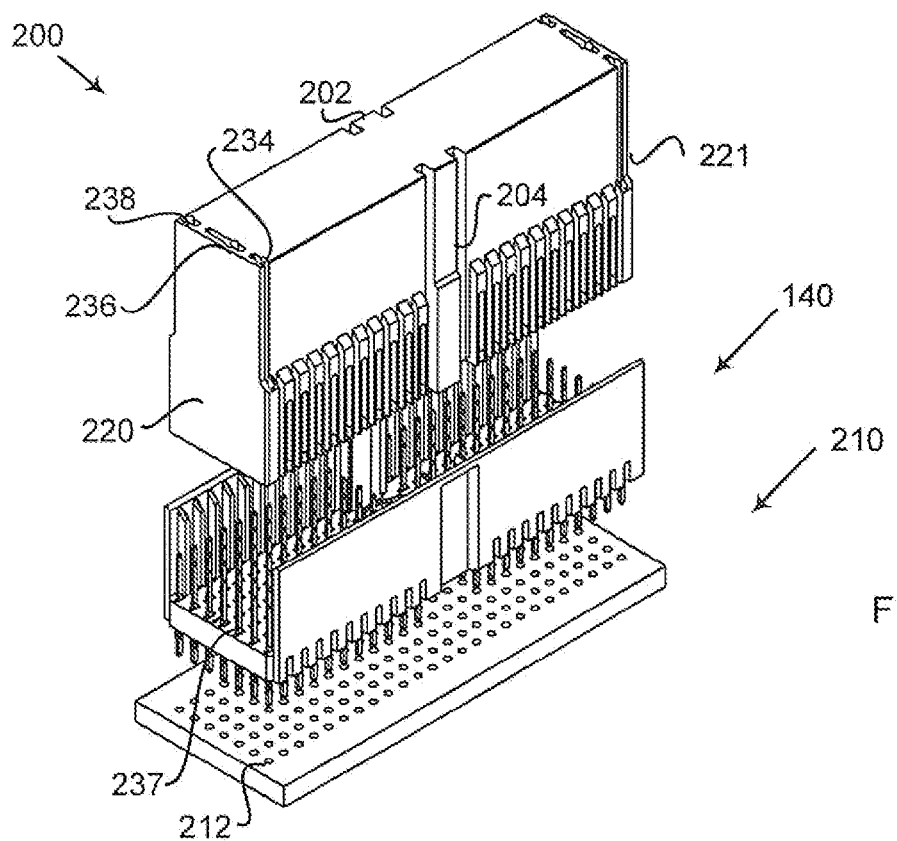
FIGURE 11A
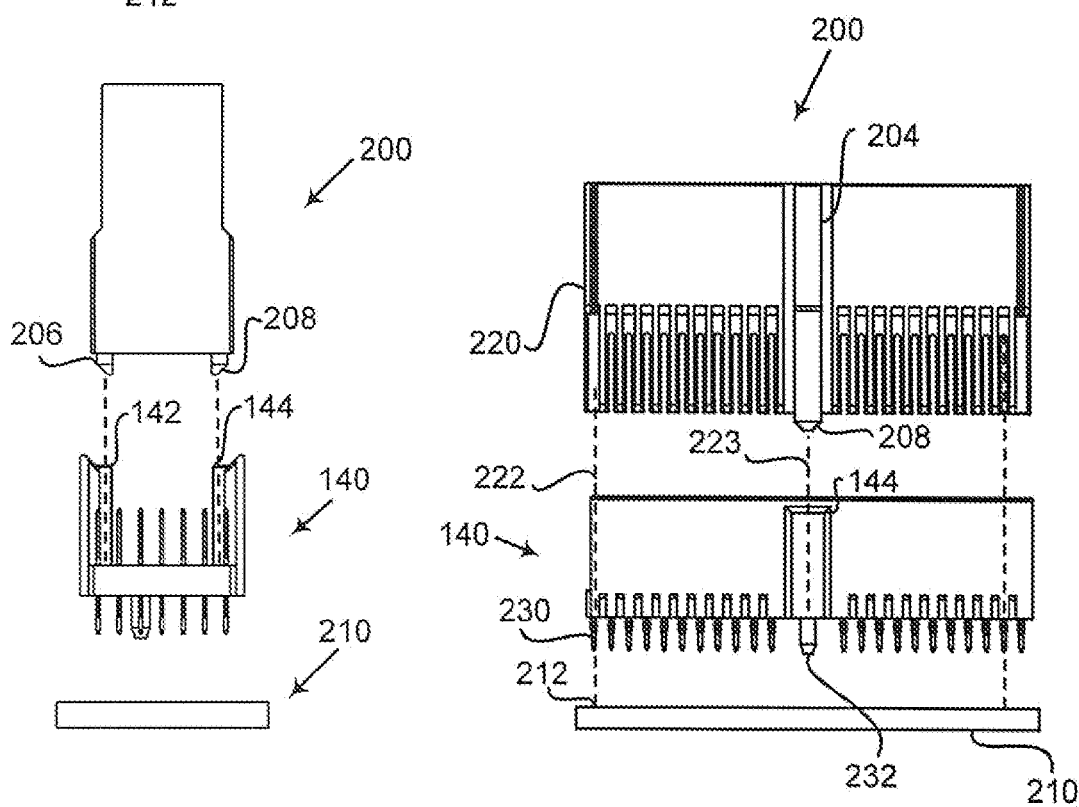
FIGURE 11B
FIGURE 11C

TOOLS FOR SEATING CONNECTORS ON SUBSTRATES

This is a divisional of U.S. application Ser. No. 13/416,860, filed on Mar. 9, 2012, issuing as U.S. Pat. No. 8,578,596 on Nov. 12, 2013, which is a divisional of U.S. application Ser. No. 10/683,204, filed on Oct. 9, 2003, issuing as U.S. Pat. No. 8,136,233 on Mar. 20, 2012, which are both incorporated by reference herein.

BACKGROUND

The present invention relates to connector tools for seating connectors on a substrate such as a printed circuit board (PCB).

Connectors are used for data transfer interfaces in computers, buses, servers, and storage and networking systems. Some examples of connectors include the Tyco/AMP Z-PACK HS3 Backplane Connectors, the 2 mm hard metric connectors and the 2 mm VHDM connectors from Tyco/AMP, Molex, Erni, and FCI.

The long, small diameter pins of these connectors may have gold plating to improve conductivity and performance at high frequencies and for corrosion protection. Care is required to prevent damage to the pins and the plating when seating the connector on a PCB. If the connector does not seat, extracting and reseating connector may destroy the connector, damage the vias (i.e., the holes in the PCB) and any thin conductive traces in nearby vias.

A single connector tool mounted on a tool press controlled by computer numerical controlled (CNC) seats the connectors. However, multiple connector tools can be mounted on the tool press in rows so all connectors are seated onto the PCB in a single press operation. Thus, more than one connector can be damaged in a single seating operation.

Connector tools have delicate structures that are machined to tight tolerance and are typically made of high strength material such as heat treated tool steel. Despite use of high strength material, the delicate structures are susceptible to damage if dropped during a tool change or transportation.

To understand the problems we now describe certain connector tools. FIG. 1A illustrates one conventional connector tool 10 that is used to seat the Tyco/AMP Z-PACK HS3 Backplane Connector and the 2 mm hard metric connectors. FIG. 1B is an enlarged view of the thin end wall 22 of the connector tool 10 shown in FIG. 1A, while FIG. 1C is an enlarged view of the thin end wall 28. FIG. 1D is a front view of the thin end wall 28. Thin end walls 22, 28 are vulnerable to damage if dropped on the floor, for example, during a tool change or transportation.

FIG. 2A illustrates a conventional connector seating tool 120 for a custom VDHM 6×10 (60-pin) connector made by Molex and Teradyne. FIG. 2B is a top view of the connector tool 120. FIG. 2C is an enlarged view showing the individually machined pin holes such as hole 122 for mating with connector pins.

FIG. 3A is a perspective view of a conventional connector tool 170 used to seat the 2 mm hard metric connector shown in FIG. 10A. FIG. 3B is a front view showing a base 171 with two sets of spaced walls 173, 175 protruding from the base. The spaced walls 173, 175 define two slot arrays 177, 179 that mate with the connector pins. The spaced walls 173, 175 have thin outer end walls 178, 180 and thin inner end walls 184, 186. The spaced walls 173, 175 are spaced from each other by gap 176. FIG. 3C is an enlarged view of the thin outer end wall 178. FIG. 3D is an enlarged view of gap 176, and the thin inner end walls 184, 186 that are susceptible to damage.

FIG. 4A is a front view of a conventional connector tool 330 for seating the power connector 270 shown in FIG. 5A. FIG. 4B is a perspective view of the connector tool 330 showing the push shoulders such as push shoulder 336 that push on the seating areas such as area 286 of the power connector 270 in FIG. 5A. FIG. 4C is an enlarged view of tool ribs 338, 340 for sliding into the slots such as slots 280, 285 of the power connector 270 shown in FIG. 5A. Because this tool has no guiding structure, misalignment between the conventional connector tool 330 and the power connector 270 before the tool ribs 338, 340 fully engage and slide into slots 280, 285 can crush the power connector 270 on the PCB.

SUMMARY OF THE INVENTION

The present invention relates to connector tools for seating connectors on a substrate. In various embodiments, the connector tools can be made by the wire electrode discharge machining (WEDM) process. The connector tools include features such as reinforced ribbed end walls, ribbed internal walls, interconnected walls and contours that reduce tool and connector damage. The connector tools may include guiding structures that align the connector tool to the connector before seating the connector so that the connector tool aligns to the connector pins and body to avoid damage to the connector and/or the substrate. The connector tools may have guiding skirts and surfaces to capture the connector in position then seat the connector. Thus, the invention reduces connector and substrate damage during manufacturing, reduces tool damage, and lowers product costs by boosting manufacturing yields.

BRIEF DESCRIPTION OF THE DRAWINGS

FIG. 1A illustrates a conventional connector tool for a Tyco/Amp HS3 connector.

FIG. 1B is an enlarged view of the end wall and the adjacent walls of the connector tool shown in FIG. 1A.

FIG. 1C is an enlarged view of the opposite end wall and the adjacent walls of the connector tool shown in FIG. 1A.

FIG. 1D is a front view of the end wall and the adjacent walls of the connector tool shown in FIG. 1C.

FIG. 2A is a perspective view of a conventional connector tool used to seat a VDHM 6×10 (60-pin) connector.

FIG. 2B is a top view of the conventional connector tool shown in FIG. 2A.

FIG. 2C is an enlarged view of part of the conventional connector tool shown in FIG. 2B.

FIG. 3A is a perspective view of a conventional connector tool for seating a 2 mm hard metric connector.

FIG. 3B is a front view showing the thin end walls and a gap in the tool base separating the set of walls in the conventional connector tool shown in FIG. 3A.

FIG. 3C is an enlarged view of the end wall of the conventional connector tool shown in FIG. 3A.

FIG. 3D is an enlarged view of the gap between the two sets of walls of the conventional connector tool shown in FIG. 3A.

FIG. 4A is a front view of a conventional connector tool for the power connector shown in FIG. 5A.

FIG. 4B is a perspective view of the conventional connector tool shown in FIG. 4A.

FIG. 4C is an enlarged view of the inner wall of the conventional connector tool shown in FIG. 4B.

FIG. 8A is a front view of the conventional connector tool for seating a connector alongside the connector tool with interconnected walls shown in FIG. 7A.

FIG. 8B illustrates and compares a conventional connector tool with brittle thin walls with the connector tool shown in FIG. 8A.

FIG. 8C is a bottom view of the connector tool shown in FIG. 8A.

FIG. 8D is a bottom view showing the connector pin arrays of FIG. 8A.

FIG. 11A is an exploded perspective view of a connector tool with strengthened end walls and guiding structures for seating a high pin density connector on a PCB.

FIG. 11B is an exploded end view of the connector tool with guiding structures for alignment when seating a connector.

FIG. 11C is an exploded front view of the connector tool with guiding structures seating the connector shown in FIG. 11A.

DETAILED DESCRIPTION OF THE PREFERRED EMBODIMENTS

Figure 5A:
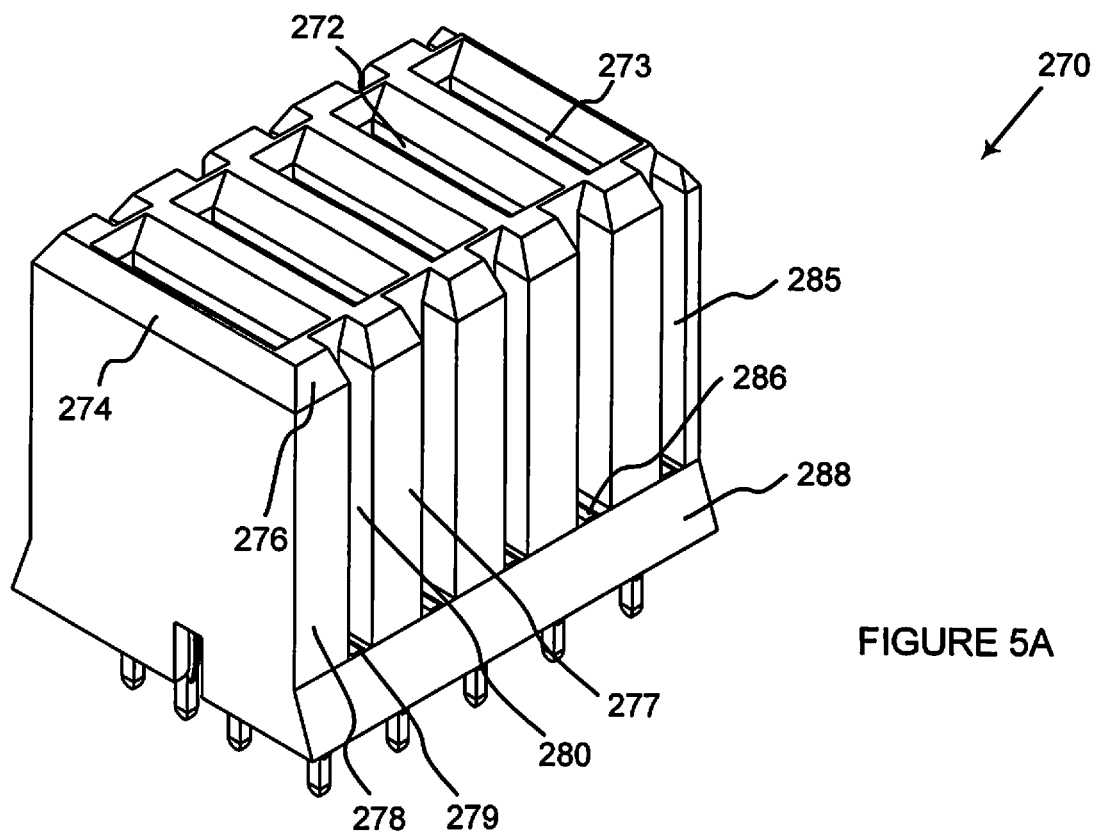
FIG. 5A is a perspective view of a power connector with slots.

The following description includes the best mode of carrying out the invention. The detailed description is made for the purpose of illustrating the general principles of the invention and should not be taken in a limiting sense. The scope of the invention is determined by reference to the claims.

We assign each part, even if structurally identical to another part, its own reference number to help distinguish where the part appears in the drawings. We use dashed circles to indicate the parts that are enlarged in separate Figures. The separate Figure is indicated by the reference number tied to the dashed circle.

Figure 6A:
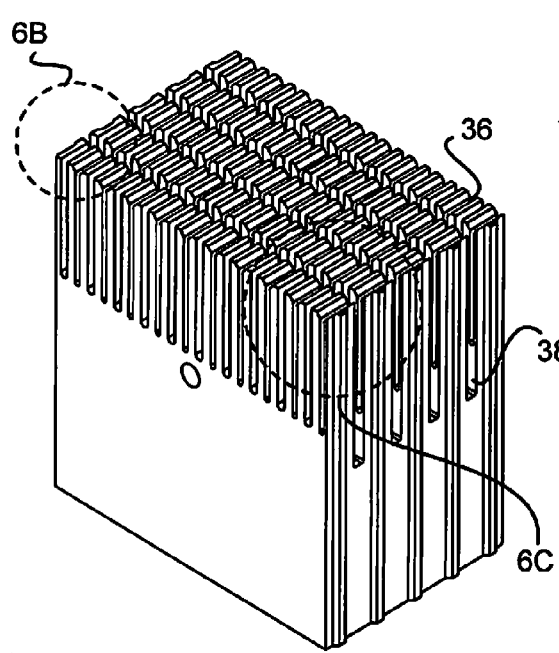
FIG. 6A is a perspective view of a connector tool with ribbed end walls for a Tyco/Amp HS3 connector.

FIG. 6A is a perspective view of a connector tool 30 that includes a machined structure that has intersecting slots such as slots 36, 38 from wall-to-wall to mate with connector pins. In an embodiment, the machined structure is machined by WEDM. The connector tool 30 is used for the Tyco/AMP Z-PACK HS3 Backplane Connectors but the type of construction can be used on other connectors as well.

Figure 6B:
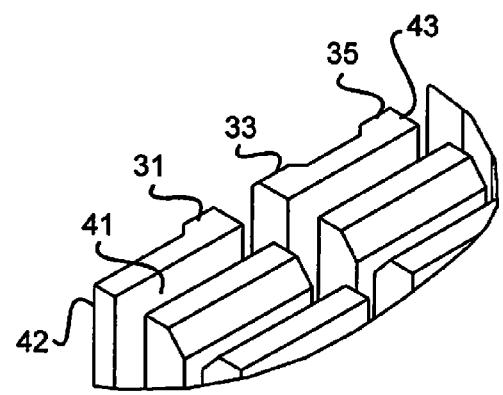
FIG. 6B is an enlarged view of the ribbed end wall of the connector tool shown in FIG. 6A.

FIG. 6B is an enlarged view showing ribbed end walls 42, 43 with ribs 31, 33 and 35 on outer surface. The ribs 31, 33 and 35 can be disposed on the outer, the inner or both surfaces to strengthen the end walls 42, 43.

Figure 6C:
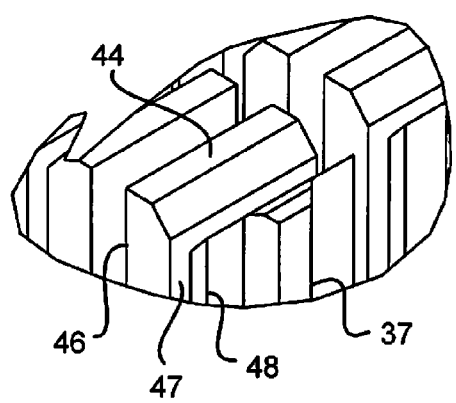
FIG. 6C is an enlarged view of the ribbed outer surface of the end wall of the connector tool shown in FIG. 6A.
Figure 6D:
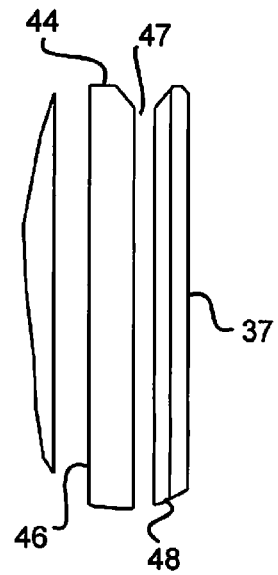
FIG. 6D is a front view of the ribbed outer end wall of the connector tool shown in FIG. 6C.

FIG. 6C is an enlarged view of the ribbed end wall 48 and a push shoulder 44 on the top of wall 46. The push shoulders contact the connector during seating onto a substrate. FIG. 6D is a front view of illustrative rib 37 that strengthens an end wall 48 without obstructing connector pins such as pin 153 shown in FIG. 10A being inserted into pin slot 47. The ribbed end wall 48 helps to reduce breakage and warping when the tool is dropped on the floor and the like. The thickness, number and location of the rib(s) on a wall can vary. The rib(s) can be on the inside and/or outside surface of the end wall, and on any internal walls such as wall 46 as long as the rib(s) do not interfere with insertion of the mating pins, or alignment of the connector and the connector tool. This rib feature is applicable therefore to many connector tools.

Figure 7A:
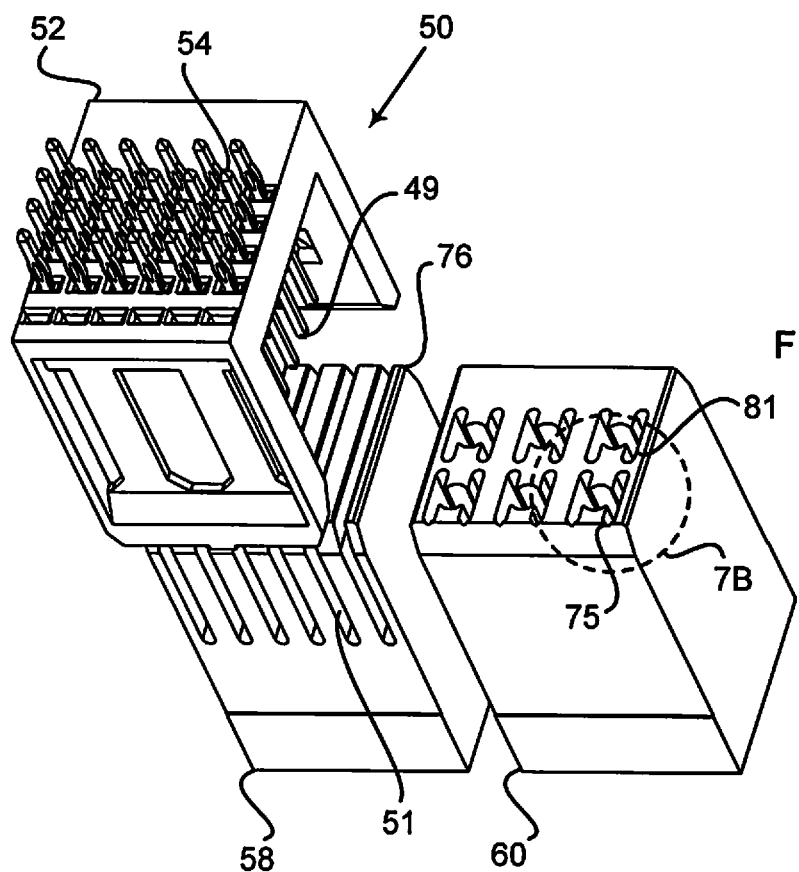
FIG. 7A is a perspective view of a connector, a conventional connector tool and a connector tool with interconnected walls and contour slots.

FIG. 7A is a perspective of the bottom of a future buss 2 mm connector 50 built to the EIA-616 industry standard. The connector includes board side connector pins 54 and mating side connector pins 49. Also shown is a conventional connector tool 58 which has wall-to-wall pin slots such as illustrative pin slot 51. In contrast, the connector tool 60 shown has an array of contours such as H-shaped contours 75, 81 with pin slots to mate with the connector pins. In addition, the conventional connector tool 58, the end wall 76 and wall edges are susceptible to warping damage and breakage when the tool is dropped.

Figure 7B:
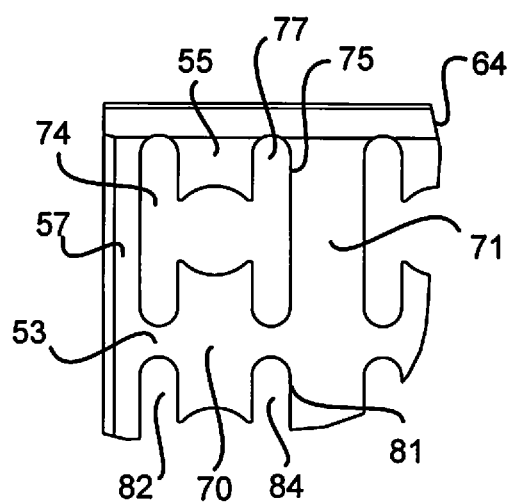
FIG. 7B is a detailed view of the connector tool with interconnected walls and contour slots shown in FIG. 7A.

FIG. 7B is an enlarged view of the H-shaped contour 75 with pin slots 74, 77. Also shown are portions of two adjacent H-shaped contours. The H-shaped contour 81 below the H-shaped contour 75 has a pin slot 84 that aligns with the pin slot 77. Similarly, the pin slot 82 aligns with the pin slot 74. The pin slots 77, 84 in H-shaped contours 75, 81 therefore mate with the connector pins and eliminate the need for a wall-to-wall pin slot such as the pin slot 51 found in the conventional connector tool 58. This machined structure provides therefore interconnected walls such as wall 53 that strengthen the connector tool 60. The interconnected walls 55 and 57 also serve to strengthen the tool without obstructing the connector pins. Interconnected walls 53, 55, 57, and 71 provide planar surfaces for seating the connector 50 on a substrate while the closed side wall 64 is beveled to reduce damage if the connector tool is dropped on the floor.

FIG. 8A is a front view of the conventional connector tool 58 for seating a connector 50 alongside the connector tool 60 having interconnected walls just described. FIG. 8B is an enlarged view of the pin slot 72 of the conventional connector tool 58 follows the insertion path 61 shown in FIG. 8A to accommodate the mating side connector pin array 49 (partially shown in FIG. 7A). The push shoulder 68 follows the tool seating path 63 to seat the connector 50 onto the substrate such as PCB 86. Each of the board side connector pins such as pin 54 has a collapsible spring eyelet 59 that collapses in diameter by deformation when forced through the smaller PCB Plated Thru Hole (PTH) 88 holding the connector 50 snugly in place. The brittle end wall 66 is vulnerable to damage due to its small thickness and the protrusion. In contrast, the connector tool 60 shown in FIG. 8B has no such protrusion and has a closed side wall 64 that keeps the tool from damaging its walls when accidentally dropped.

FIG. 8C is a bottom view of the connector tool 60 shown in FIGS. 7A and 8A. WEDM can be used to form the array of contours shown. WEDM has the advantages of machining very fine geometry deep into hard material such as tool steel within desired tolerances. A WEDM start hole 80 is first established before migrating to form a set of H-shaped pin slots such as slots 82, 84. The interconnected walls surrounding the slots 82, 84 strengthen the connector tool 60 and provide increased seating surface compared to the conventional connector tool 58. The end wall 78 and the closed side wall 64 are integral reducing warping damage and breakage if the tool is dropped. FIG. 8D shows the bottom view with connector pins such as pin 54 of the connector 50 that are to be seated into the PCB PTH 88 by the connector tool 60.

Figure 9A:
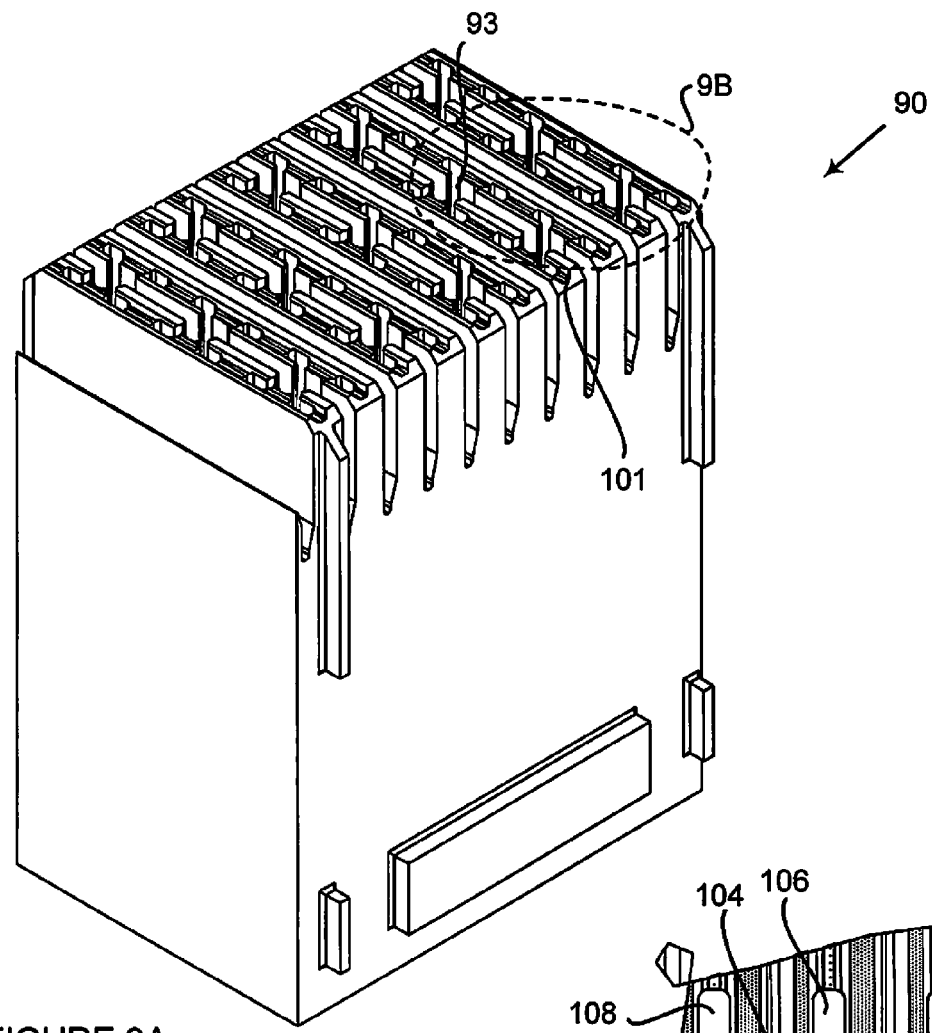
FIG. 9A is a perspective view of a connector tool with interconnected walls for a VHDM 60-pin connector.
Figure 9B:
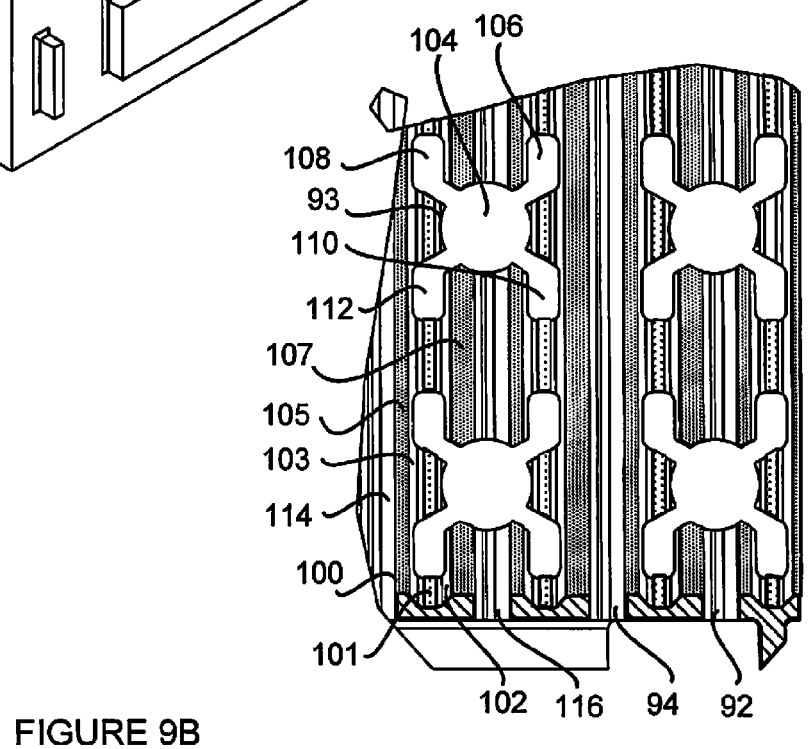
FIG. 9B is a top view of the connector tool with interconnected walls shown in FIG. 9A.

FIG. 9A is a perspective view of an embodiment of a connector tool 90. It can be used for example in seating a custom VDHM 6×10 (60-pin) connector made by Molex and Teradyne. FIG. 9B is an enlarged top view of the connector tool 90 shown in FIG. 9A. WEDM is used to form a crab-shaped contour 93 from starting location of the WEDM start hole 104 then migrating out to form contiguous pin slots 106, 108, 110 and 112. WEDM also forms the recess 101 indicated by the light shading that aligns with pin slots 108, 112 that are sandwiched by elevated shoulders 105, 107 (darker shading). The elevated shoulders 105, 107 form beveled sides 102, 103 with the recess 101 to help guide the mating connector pins into pin slots 108, 112 in case of slight misalignment between the tool and the connector. Slots such as slots 92, 94, 114, and 116 are ground shield clearance slots for a VHDM connector (not shown). Thus, a crab-shaped contour 93 can replace four individual connector pin holes such as hole 122 shown in FIG. 2C.

Figure 10A:
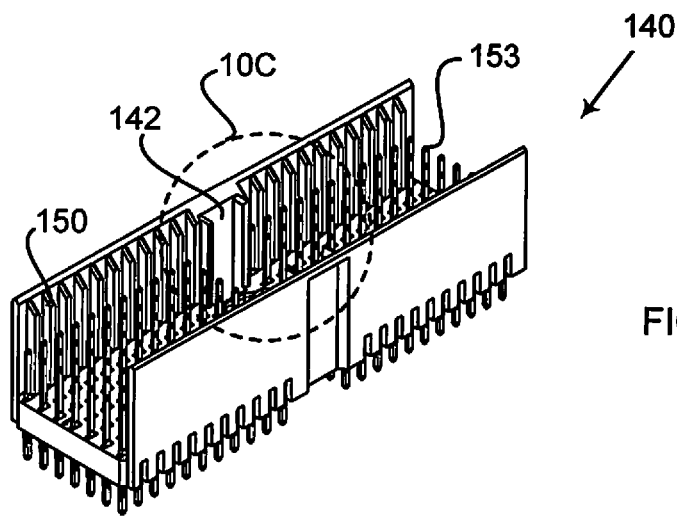
FIG. 10A is a perspective view of a high pin density connector for a 2 mm hard metric connector.

FIG. 10A is a perspective view of a high density multi-pin connector 140 such as the 2 mm hard metric connector built to IEC-1076 standards with an array of connector pins such as pin 153. Rows of reinforcement ribs such as rib 150 on each side of the wall are staggered with respect to the rows of connector pins such as pin 153 to increase connector rigidity. Connector 140 also has slots 142, 144 that will be explained below in connection with FIG. 11B.

Figure 10B:
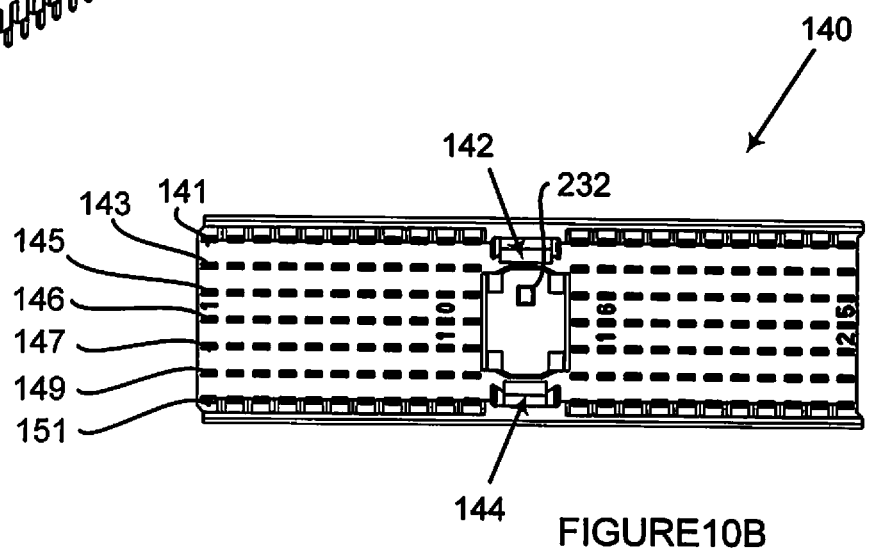
FIG. 10B is a top view of the high pin density connector shown in FIG. 10A.
Figure 10C:
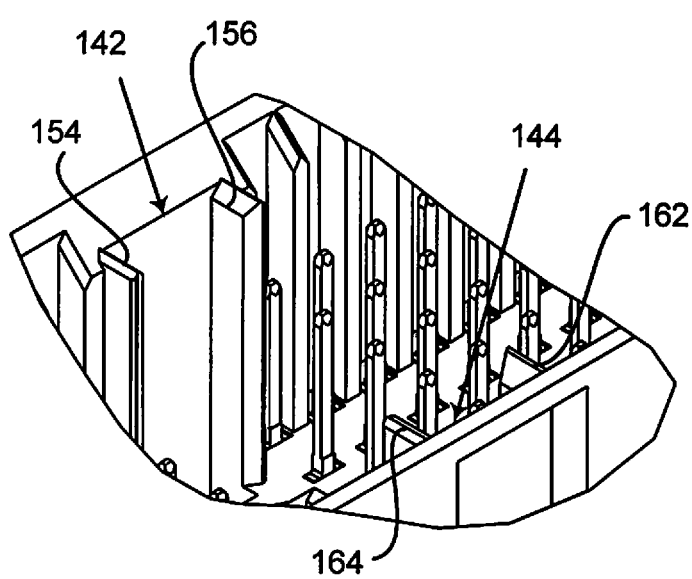
FIG. 10C illustrates the connector slots of the high pin density connector shown in FIG. 10A.

FIG. 10B is a top view showing an array of connector pins such as pins 141, 143, 145, 146, 147, 149 and 151, the slots 142, 144, and a connector polarity key such as pin zero 232 that is positioned to identify the connector. FIG. 10C is an enlarged view showing the connector walls 154, 156, 162 and 164 with chamfered corners forming the slots 142, 144.

FIG. 11A is a perspective view of a connector tool 200 with slotted outer end walls 220, 221 and guiding structure 202, 204 seating the high density multi-pin connector 140 described in FIG. 10A onto a substrate with connector pin vias such as via 212 in a substrate such as the PCB 210. A number of slots 234, 236, and 238 are formed by WEDM to accommodate the end row of connector pins such as connector pin 237.

FIG. 11B is an end view of FIG. 11A showing the guiding structures having protruding heads with chamfered edges 206, 208 sliding through the connector slots 142, 144 to seat the connector 140 onto the PCB 210.

FIG. 11C is a front view of connector tool 200 shown in FIGS. 11A-11B. The slotted outer end wall 220 follows the pin insertion path 222 to accommodate the connector pin 230 that is to be seated into the PCB PTH 212 on the PCB 210. The guiding structure 204 has a protruding head with chamfered edges 208 that follows path 223 into the slot 144 to align the connector 140 before seating the connector pins such as pin 230 and pin zero 232 onto the PCB 210.

Figure 12A:
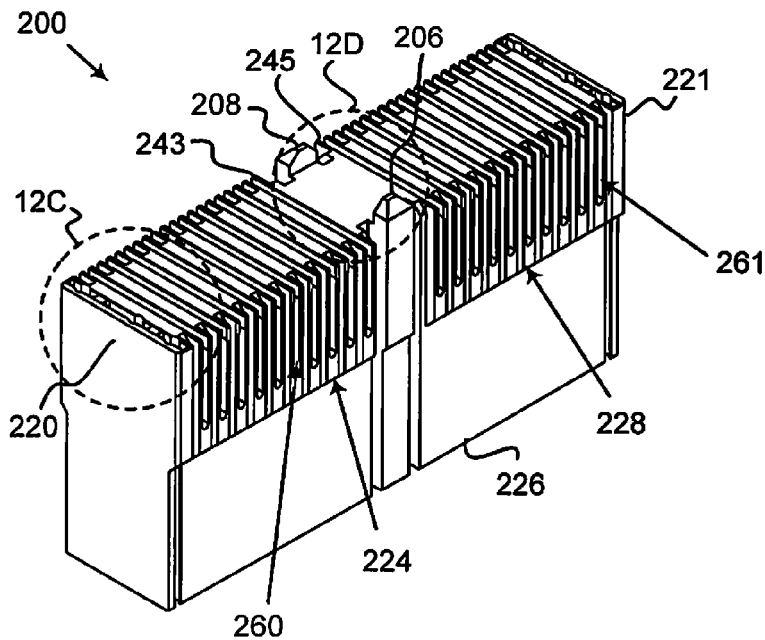
FIG. 12A is a perspective bottom view of a connector tool with reinforced end walls and guiding structures.

FIG. 12A is a perspective view of the connector tool 200 shown in FIGS. 11A-11C. The connector tool 200 includes a structure with a base 226 with two opposite sets of spaced walls 224, 228 protruding from each end of the base. The two opposite sets of spaced walls 224, 228 define slot arrays 260, 261. The slot arrays 260, 261 include slotted outer end walls 220, 221 and inner end walls 243, 245 that are reinforced through interconnected structures.

Figure 12B:
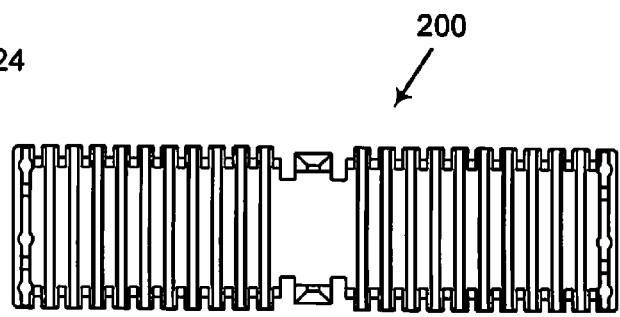
FIG. 12B is a bottom view of the connector tool shown in FIG. 12A.

Also is shown the protruding heads with chamfered edges 206, 208 for connector alignment. FIG. 12B is a bottom view of the connector tool 200 shown in FIG. 12A.

Figure 12C:
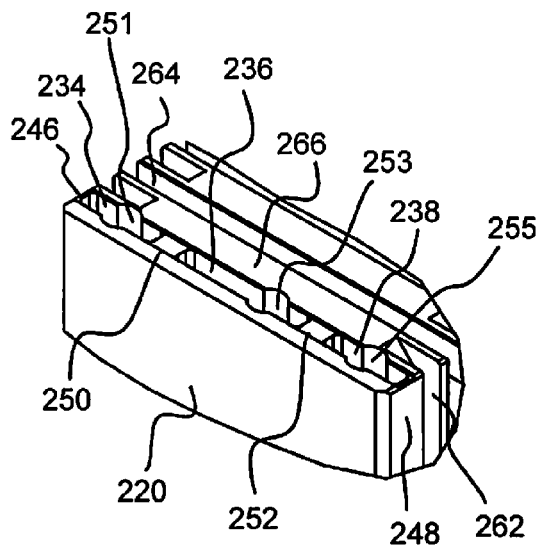
FIG. 12C is an enlarged view of the interconnected outer end wall of the connector tool shown in FIG. 12A.

FIG. 12C is an enlarged view of the slotted outer end wall 220 which is no longer a thin wall susceptible to warping and breaking if accidentally dropped. Instead the slotted outer end wall 220 is adjoined to the adjacent inner wall 266. A plurality of pin slots 234, 236, and 238 can be formed using WEDM so as to accommodate the end row connector pins such as pin 237 shown in FIG. 11A. The starting location of the WEDM start holes are holes 251, 253, and 255. It is not important that the pin slots 234, 236 and 238 be perforated from top to bottom since blind slotting with sufficient depth will accommodate the end row connector pins. The slotted outer end wall 220 maintains its strength and integrity through the adjoining interconnected structures 246, 248, 250, and 252 that may extend partially or fully into the base 226. Slots such as slot 262 provide clearance for the connector ribs such as rib 150 shown in FIG. 10A and pin slot 264 accommodates the mating connector pin.

Figure 12D:
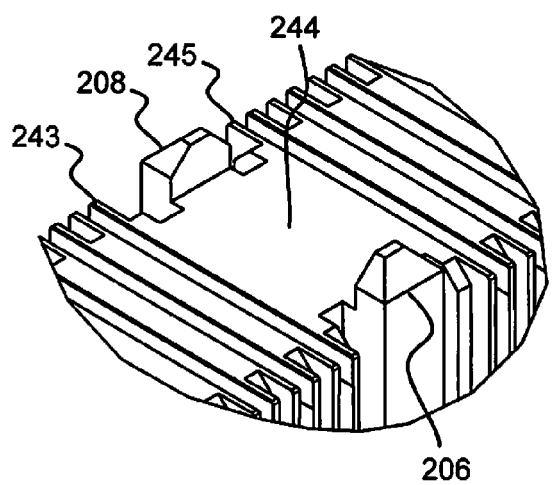
FIG. 12D is an enlarged view of the guiding structure and the interconnected inner end walls of the connector tool shown in FIG. 12A.

FIG. 12D is an enlarged view showing the protruding heads with chamfered edges 206, 208 that align the connector tool 200 with the connector slots 142, 144 shown in FIG. 11B. The opposite inner end walls 243, 245 are strengthened by adjoining to a common interconnecting structure 244 that extends fully or partially into the base between the spaced apart opposite inner end walls 243, 244. In this embodiment, the interconnecting structure 244 fills the gap 176 that exists in the conventional connector tool 170 shown in FIG. 3B.

Figure 5B:
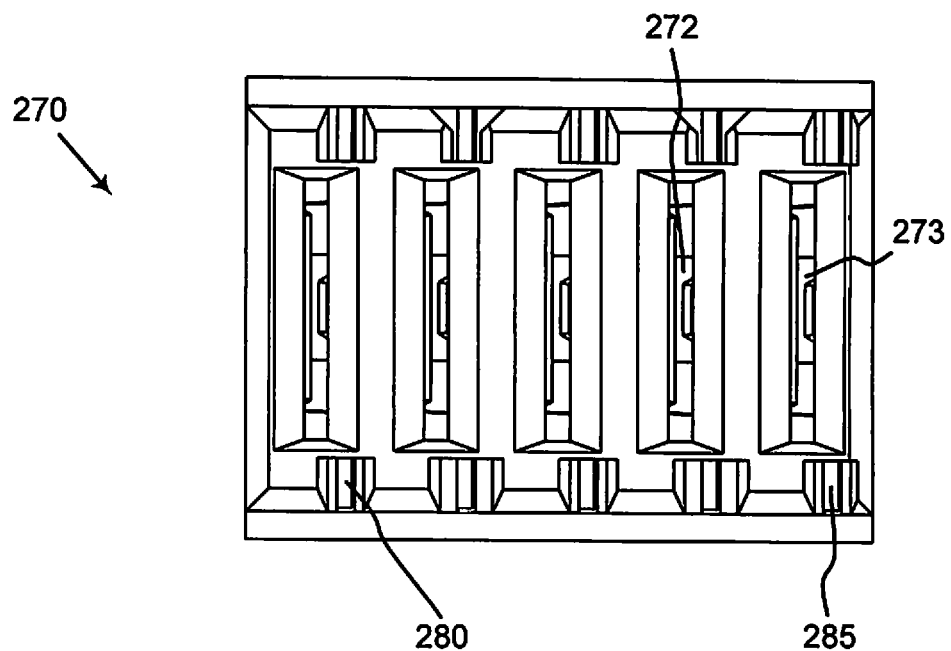
FIG. 5B is a top view of the power connector shown in FIG. 5A.

FIG. 5A is a perspective view of a power connector 270 by Tyco/Amp where the connector top surface is chamfered on four sides into beveled surfaces such as surfaces 274, 276. The side walls 277, 278 have slots such as slot 280. The base of slot 280 is a seating area 279 for the push shoulder. A skirt 288 is slanted at the base of the connector. The power connector 270 consists of five mating pin slots such as slots 272, 273. FIG. 5B is a top view of the power connector 270 showing the slots 280 and 285 where the connector tool ribs must slide down to avoid crushing the connector during seating of the connector on the substrate.

Figure 13A:
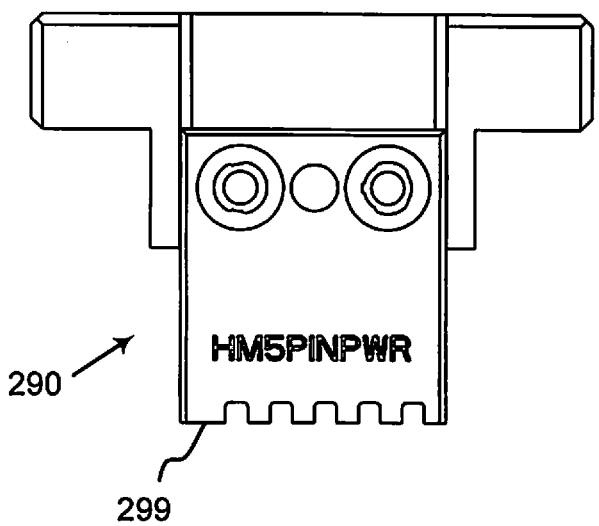
FIG. 13A is a front view of a connector tool with a guiding skirt structure for the power connector shown in FIG. 5A.
Figure 13B:
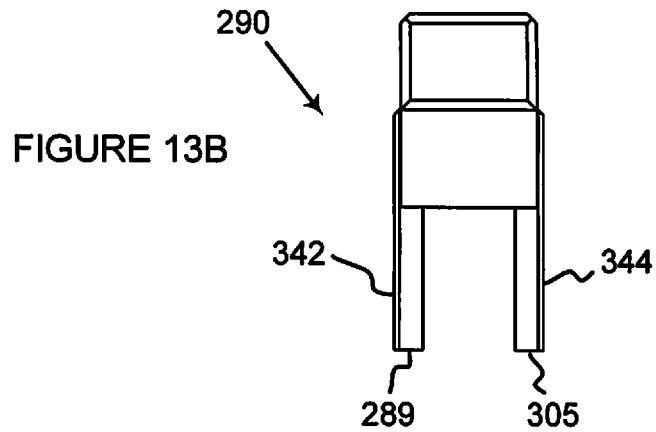
FIG. 13B is a side view of the connector tool shown in FIG. 13A.
Figure 13C:
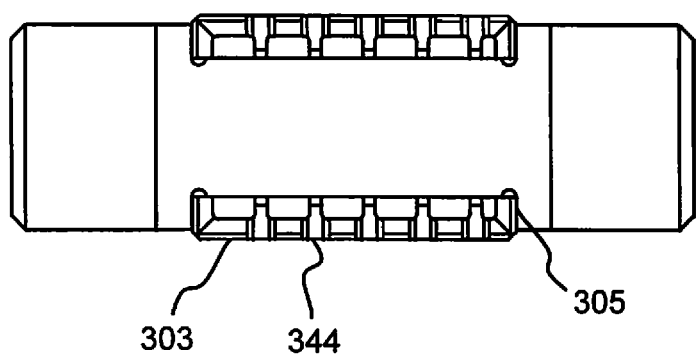
FIG. 13C is a bottom view showing the guiding skirt structure in FIG. 13A.

FIG. 13A is a front view of a power connector tool 290. The tool includes a guiding skirt structure such as skirt 299. FIG. 13B is a front view of the connector tool 290 which is a machined structure with opposite vertical parallel walls 342, 344 and skirts 289, 305 as retaining corners. FIG. 13C is the bottom view of the connector tool 290 showing a vertical parallel wall 344 with guiding skirt structure such as skirts 303 and 305. These structures help to position the power connector 270 under the connector tool 290.

Figures 14A, 14B:
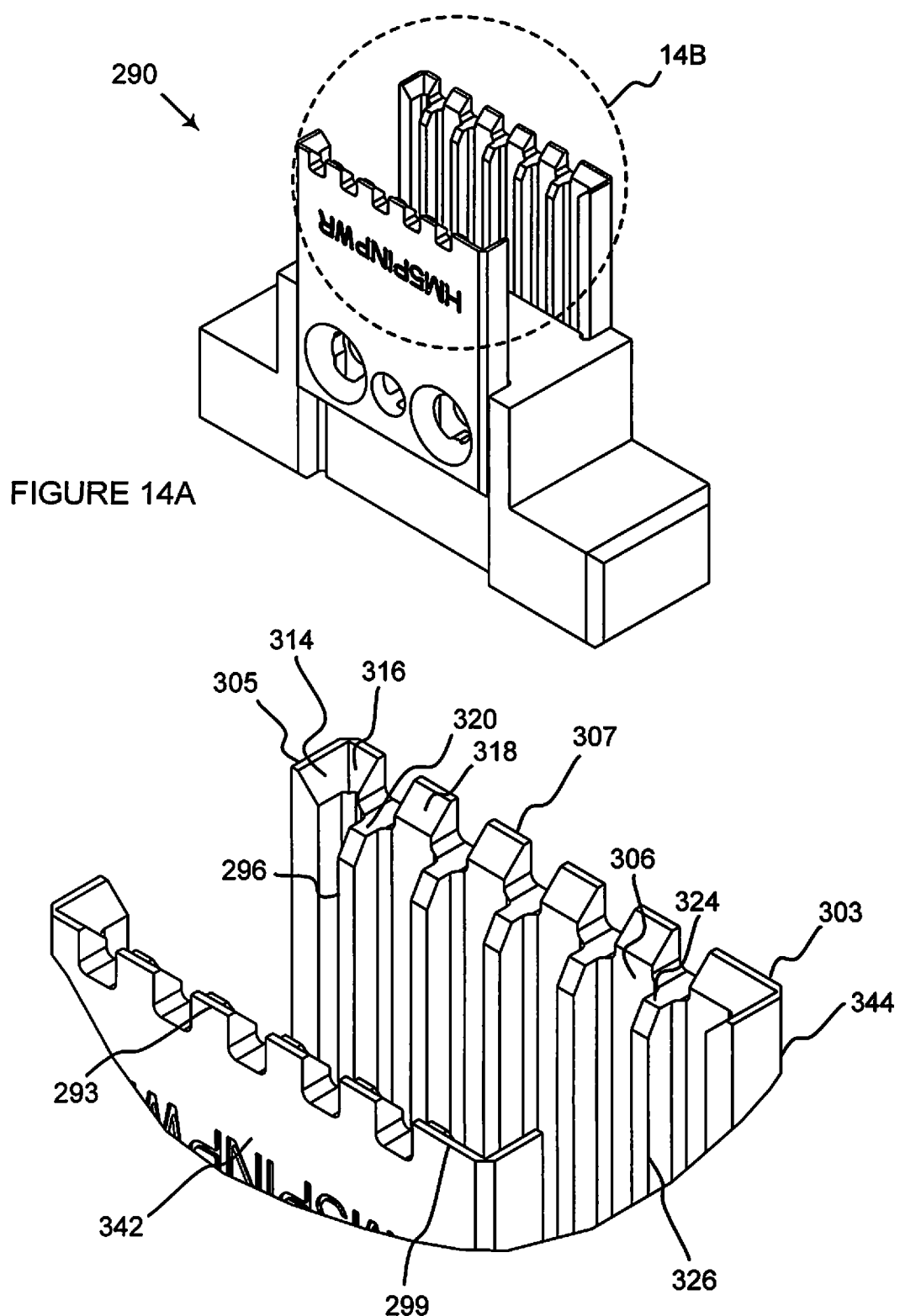
FIG. 14A is a perspective view of the connector tool shown in FIG. 13A.
FIG. 14B is a detailed view showing the guiding skirt structure of the connector tool shown in FIG. 14A.

FIG. 14A is a perspective view of the power connector tool 290 shown in FIGS. 13A-13C. FIG. 14B is an enlarged view of the guiding skirt structure. The power connector tool 290 includes a plurality of spaced and corner chamfered tool ribs such as tool ribs 296, 326. The tool ribs 296, 326 can be any suitable length, but are illustrated as terminating at the level of the vertical parallel wall 344. The tool ribs 296, 326 protrude orthogonally from the inner surface of the vertical parallel wall 344 and slide into the corresponding connector slots of the power connector 270. The corner chamfered end of the tool ribs 296, 326 are surfaces such as push shoulders 320, 324 for seating the connector onto the substrate or PCB. The guiding skirt structure may include discrete skirts such as skirts 293, 299, 303, 305 and 307 that extend above the vertical parallel walls such as walls 342, 344 and are spaced with a guiding rib separation. The guiding skirt structure has discrete internal beveled or chamfered surfaces such as 314, 316, and 318 that align the power connector 270 with the connector tool 290 before seating the power connector 270 shown in FIG. 5A onto the substrate with an evenly distributed force. The guiding skirt structure solves the problem of the connector tool crushing the connector due to slight misalignment that arises from tolerances build up by the equipment, the connector tool precision, connector and substrate placement.

In another embodiment not shown, the guiding skirt structure does not have to be discrete. The guiding skirt structure may include a skirt with an internal beveled or chamfered surface that extends continuous along the vertical parallel walls. The guiding skirt structure with internal beveled surface is applicable to other connector tools to reduce connector damage by connector positioning before seating the connector onto the substrate.

What is claimed is:

1. A connector tool for seating a connector having an array of connector pins onto a substrate comprising:
   a machined structure comprising:
      an interconnected structure comprising:
         a planar surface that contacts the connector without touching the connector pins, and
         one or more contours that define a plurality of slots for mating with the array of connector pins, wherein each contour is H-shaped, and wherein each contour includes two or more slots for mating concurrently with the two or more connector pins.

2. The connector tool of claim 1, wherein the connector tool is machined by Wire Electrode Discharge Machining (WEDM) and the substrate is a printed circuit board.

3. A connector tool for seating a connector with an array of male connector pins onto a substrate, comprising:
   a machined structure comprising:
      two or more interconnected walls that form an array of two or more H-shaped contours, wherein the H-shaped contours comprise:
         two or more pin slots, wherein each pin slot mates with two or more of the male connector pins; and
      a planar surface formed at a bottom end of the machined structure that is adapted to push the connector onto the substrate.

4. The connector tool of claim 3, wherein the machined structure is a rectangular prism shape and the two or more H-shaped contours extends from a top end to the bottom end of the machined structure.

5. The connector tool of claim 3, wherein the two or more H-shaped contours are arranged in rows and columns, wherein the H-shaped contours include pin slots aligned to mate with the array of male connector pins, wherein the pin slots do not form a wall-to-wall slot.

6. The connector tool of claim 3, wherein the machined structure includes closed side and/or end walls to reduce damage if the connector tool is dropped on a hard surface.

7. The connector tool of claim 6, wherein the closed side walls are beveled with respect to the planar surface.

8. The connector tool of claim 3, wherein the two or more H-shaped contours includes two rows of three H-shaped contours.

9. The connector tool of claim 3, wherein each H-shaped contour includes a Wire Electrode Discharge Machining (WEDM) start hole that extends to the pins slots.

10. The connector tool of claim 3, wherein the substrate is a printed circuit board (PCB) and the connector tool seats the connector pins onto the PCB.

11. The connector tool of claim 10, wherein the connector tool is for seating a future buss 2 mm connector 50 that is built according to the EIA-616 industry standard.

* * * * *